(12) United States Patent
Min

(10) Patent No.: US 6,777,734 B2
(45) Date of Patent: Aug. 17, 2004

(54) STRUCTURE OF SRAM HAVING ASYMMETRIC SILICIDE LAYER

(75) Inventor: Byung-ho Min, Ichcon-shi (KR)

(73) Assignee: Hynix Semiconductor Inc., Gyunggi-do (KR)

(*) Notice: Subject to any disclaimer, the term of this patent is extended or adjusted under 35 U.S.C. 154(b) by 0 days.

(21) Appl. No.: 10/331,269

(22) Filed: Dec. 30, 2002

(65) Prior Publication Data

US 2004/0014277 A1 Jan. 22, 2004

(30) Foreign Application Priority Data

Jul. 16, 2002 (KR) .................... 10-2002-0041801

(51) Int. Cl.[7] .................. H01L 27/108; H01L 29/76; H01L 29/94; H01L 31/119
(52) U.S. Cl. .................. 257/296; 257/288
(58) Field of Search .................. 257/68, 288, 296, 257/336, 344, 347, 350, 401, 408, 757

(56) References Cited

U.S. PATENT DOCUMENTS

| 5,126,279 | A | | 6/1992 | Roberts | 437/52 |
| 5,872,030 | A | | 2/1999 | Huang | 438/210 |
| 6,020,242 | A | * | 2/2000 | Tsai et al. | 438/279 |
| 6,096,595 | A | * | 8/2000 | Huang | 438/238 |
| 6,198,173 | B1 | | 3/2001 | Huang | 257/903 |
| 6,236,086 | B1 | * | 5/2001 | Cheng | 257/355 |

* cited by examiner

Primary Examiner—David Nhu
(74) Attorney, Agent, or Firm—Marshall, Gerstein & Borun LLP

(57) ABSTRACT

The present invention relates to a structure of a static random access memory (SRAM) having an asymmetric silicide layer and a method for manufacturing the same. The method for manufacturing a static random access memory (SRAM) having an asymmetric silicide layer, wherein the SRAM is provided with transfer transistors and actuating transistors, the method including the steps of: preparing a semiconductor substrate provided with a low structure of a predetermined configuration; forming gate electrodes of the transfer transistors and the actuating transistors on the semiconductor substrate with being spaced by a predetermined distance; forming spacers on side walls of the transfer transistors and the actuating transistors; forming the transfer transistors implanting impurities into a portion of the semiconductor substrate between the gate electrodes and source/drains of the actuating transistors; forming a silicide blocking layer on a top of regions of the transfer transistors; and forming a silicide layer on a top of gate electrodes of the actuating transistors and a surface of source/drain electrodes.

3 Claims, 3 Drawing Sheets

US 6,777,734 B2

STRUCTURE OF SRAM HAVING ASYMMETRIC SILICIDE LAYER

BACKGROUND OF THE INVENTION

1. Field of the Invention

The present invention relates to a structure of a static random access memory (SRAM) having an asymmetric silicide layer and a method for manufacturing the same, and more particularly, to a structure of a static random access memory (SRAM) having an asymmetric silicide layer and a method for manufacturing the same which are capable of increasing the cell ratio without changing the size of an actuating transistor or an actuating transistor to form the SRAM.

2. Description of the Related Art

Generally, although an SRAM is inferior in memory capacity to a dynamic random access memory (DRAM), it has been widely used in the memory field such as a cash memory of a computer which requires high speed operation since it operates.

Typically, the SRAM cell is composed of a flip flop circuit provided with a pair of actuating transistors and a pair of actuating transistors, so that memory information is conserved by the voltage difference between an input and an output terminal of the flip flop, i.e., electrical charges accumulated in a cell node. Also, since the electrical charges are constantly compensated from the power source Vcc through a p-channel metal oxide semiconductor (PMOS) transistor as an actuating transistor or a load resistor, the SDRAM does not require a refresh function, as does a DRAM.

FIG. 1 is a view showing the circuit of a conventional SRAM cell. Referring to FIG. 1, the circuit of a SRAM cell includes a pair of actuating transistors 10 provided with a PMOS transistor 12 and an n-channel metal oxide semiconductor (NMOS) transistor 14 being connected to the terminals of a power supply successively and a pair of actuating transistors 20 connecting its source to a gate electrode of the actuating transistor 10 alternately. Here, the source of the transfer transistor 20 is crossed at a common node of the PMOS transistor 12 and the NMOS transistor 14 of the actuating transistors 10. The terminals of the power source are connected to a drain of the PMOS transistor 12 of the actuating transistors 10 and a ground terminal is connected to the source of the NMOS transistor 14. A word line (WL) is connected to gate electrodes of the actuating transistors 20 and bit lines BL, /BL are connected to the source.

FIGS. 2a to 2c are cross-sectional views illustrating a method for manufacturing an SPAM in accordance with a prior art. Referring to FIGS. 2a to 2c, a conventional method for manufacturing an SRAM will now be described. Here, methods for manufacturing a PMOS transistor 12 as an actuating transistor 10 of an SRAM cell and an NMOS transistor as a transfer transistor 20 as shown in FIG. 1 are explained for simplicity.

As shown in FIG. 2a, a device isolation layer 2 is formed on a semiconductor substrate 1 and an n-well 3 and a p-well 4 are formed in the semiconductor substrate 1, respectively. A gate insulating layer 5 and gate electrodes 6 of the transfer transistors 20 and the actuating transistor, e.g., the PMOS transistor 12, are sequentially formed on top of the n-well 3 and the p-well 4 of the semiconductor substrate 1. Also, spacers 7 are formed on a side wall of the gate electrodes 6, a p+ source/drain 8 of the actuating transistor is formed on the n-well 3 and n+ source/drain 9 of the transfer transistor 20 is formed on the p-well 4. Here, each of the source/drains 8, 9 employs a lightly doped drain (LDD) structure.

Subsequently, as shown in FIG. 2b, a silicide layer 11 is formed on a top of the actuating transistor 12 and the gate electrodes 6 of the transfer transistor 20 and a surface of the source/drain electrodes 8, 9 by performing a salicide process.

Then, as shown in FIG. 2c, an interlayer insulating layer 13 is formed on an entire surface of the resultant structure formed with the silicide layer 11, a contact hole is formed in the interlayer insulating layer 13 and contact electrodes 15 are formed with a conductive layer to connect the actuating transistor 12 and the source/drain of the transfer transistor 20.

After the constructed SRAM cell applies a voltage opposite to each other to the bit lines BL, /BL to store data in the cell, the transfer transistor 20 is turned on by applying the driving power to the word line and the voltage of the bit lines BL, /BL is stored at a common node of the PMOS and the NMOS of the actuating transistor 12 based on the status of the transfer transistor. After the bit lines BL, /BL are precharged with the same voltage to read the data stored at the SRAM cell, the bit lines BL, /BL change into electrical potentials different form each other due the a valued stored at the actuating transistor 10 by applying the driving power to the word line. This result is sensed by a sense amplifier and the difference between the potentials is amplified to thereby read the data.

Conventionally, there is a major parameter called a cell ratio to secure a stable data maintaining function and a data stability during a data access. If the precharged transfer transistor 20 is turned on to read the data of the SRAM cell, a potential of one of the bit lines BL, /BL is changed, whereby the stability of the data is dependent on the force of driving a current of the actuating transistor 10. To understand this effect, the ratio between the current driving forces of the actuating transistor/transfer transistor is defined as a cell ratio, and preferably is approximately larger than two.

Whereas, in the SRAM cell, there is a method to increase a width/length ratio of the transistor so as to increase the cell ratio in a given electron mobility and gate capacitance. A method to reduce the length for the same width has a limit due to the fixation of a minimum value to supply a given processor, therefore, a method to increase the width for the same length has been widely used. However, it causes an increase in the area of the SRAM cell, thereby making a high integration of the semiconductor device difficult.

SUMMARY OF THE INVENTION

It is a major object of the present invention to solve the above mentioned problems of the prior art and to provide a structure of a static random access memory (SRAM) having an asymmetric silicide layer which is capable of increasing the cell ratio without increasing the size of an SRAM cell by reducing the current driving force of a transfer transistor in comparison with that of the actuating transistor, this is achieved by increasing surface resistance of the transfer transistor by not forming a silicide thereon and decreasing surface resistance of the actuating transistor by forming a silicide thereon.

It is another object of the present invention to provide to a method for manufacturing a static random access memory (SRAM) having an asymmetric silicide layer which is capable of increasing a cell ratio without increasing the size of an SRAM cell by reducing the current driving force of a transfer transistor in comparison with that of the actuating transistor, this is achieved by increasing the surface resistance of the transfer transistor by not forming a silicide thereon and decreasing surface resistance of the actuating transistor by forming a silicide thereon.

In accordance with one aspect of the present invention, there is provided a structure of a static random access memory (SRAM) having an asymmetric silicide layer, wherein the SRAM is provided with transfer transistors and actuating transistors, the structure including: a semiconductor substrate provided with a substructure of a predetermined configuration; a gate insulating layer and gate electrodes of the transfer transistors and the actuating transistors formed on the semiconductor substrate spaced at a predetermined distance; a spacer formed on side walls of the gate electrodes of the transfer transistors and the actuating transistors, respectively; source/drain electrodes of the transfer transistors and the actuating transistors implanted into a portion of the semiconductor substrate placed between the gate electrodes; a silicide blocking layer formed on the top region of the resultant structure of the transfer transistor; and a silicide layer formed on a top of the gate electrodes of the actuating transistors and surfaces of the source/drain electrodes.

Preferably, the silicide blocking layer is made of an oxide material.

Preferably, The widths of the gate electrodes of the transfer transistors are equal to those of the actuating transistors.

In accordance with another aspect of the present invention, there is provided a method for manufacturing a static random access memory (SRAM) having an asymmetric silicide layer, wherein the SRAM is provided with transfer transistors and actuating transistors, the method including the steps of: preparing a semiconductor substrate provided with a substructure of a predetermined configuration; forming gate electrodes of the transfer transistors and the actuating transistors on the semiconductor substrate being spaced at a predetermined distance; forming spacers on side walls of the transfer transistors and the actuating transistors; forming a silicide blocking layer on the top regions of the transfer transistors; and forming the transfer transistors implanting impurities into a portion of the semiconductor substrate between the gate electrodes and source/drains of the actuating transistors.

BRIEF DESCRIPTION OF DRAWINGS

Other objects and aspects of the present invention will become apparent from the following description of the embodiments with reference to the accompanying drawings in which.

DESCRIPTION OF THE PREFERRED EMBODIMENTS

Figure 1:
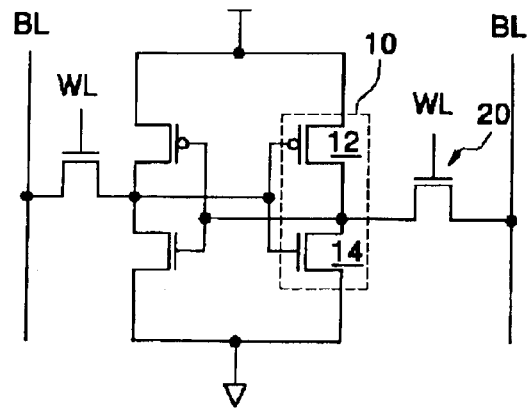
FIG. 1 is a view showing a conventional circuit of an SRAM cell.
Figure 2A:
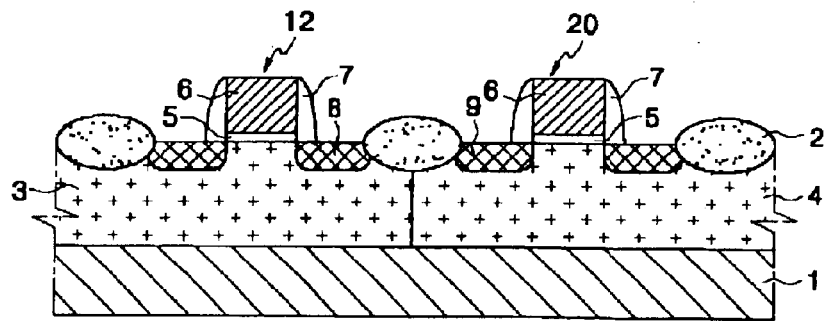
FIGS. 2a to 2c are cross-sectional views illustrating a method for manufacturing an SRAM in accordance with a prior art.
Figure 2B:
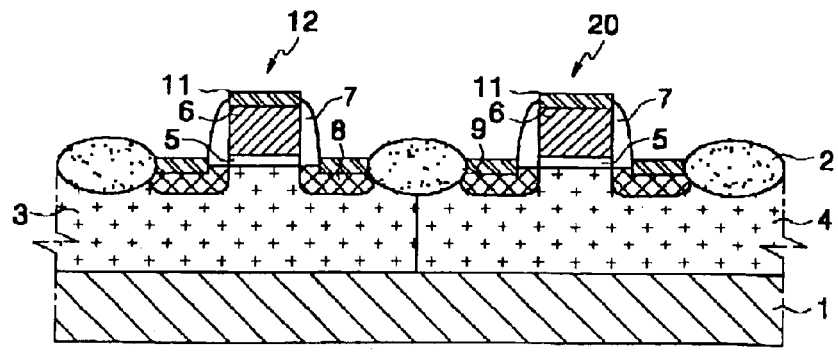
Figure 2C:
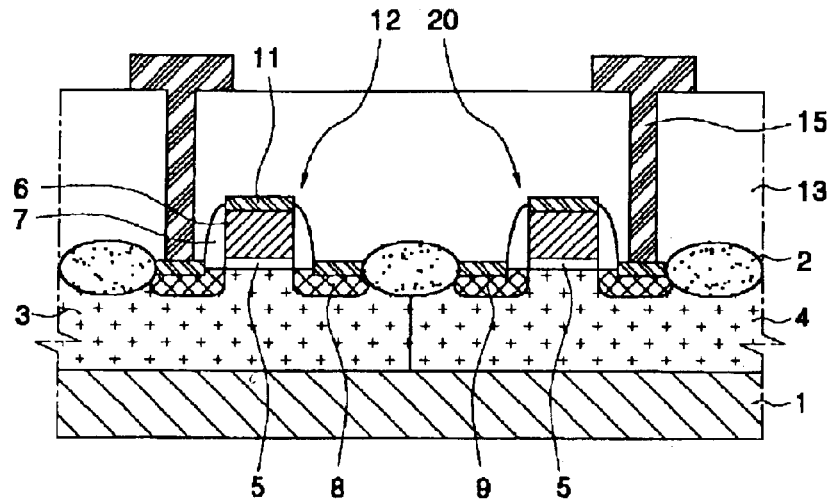

A preferred embodiment of the present invention will now be described with reference to the accompanying drawings. These embodiments are described by way of example, and therefore these embodiments do not limit the scope of the present invention. In the following description, same drawing reference numerals are used for the same elements even in different drawings.

FIGS. 3a to 3d are cross-sectional views illustrating a method for manufacturing an SRAM having an asymmetric silicide layer in accordance with a preferred embodiment of the present invention. Referring to the drawings, the SRAM manufacturing method of the present invention is described hereinafter. Here, methods for manufacturing a PMOS transistor 12 as an actuating transistor 10 of an SRAM cell and an NMOS transistor as a transfer transistor 20 as shown in FIG. 1 are explained for simplicity.

Figure 3A:
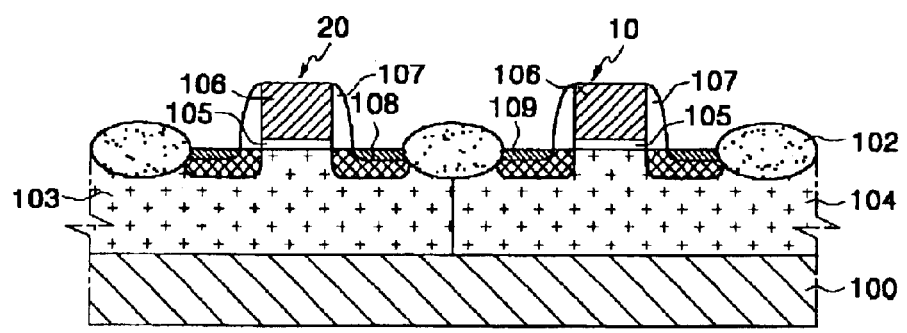
FIGS. 3a to 3d are cross-sectional views illustrating a method for manufacturing an SPAM having an asymmetric silicide layer in accordance with a preferred embodiment of the present invention.

Primarily, as shown in FIG. 3a, a semiconductor substrate 100 provided with a substructure of a predetermined configuration is prepared. Then, n-wells 103, 104 and a p-well (not shown) are formed in the semiconductor substrate 100. A gate insulating layer 105 and gate electrodes 106 are sequentially formed on top portions of he semiconductor substrate 100 formed on the n-wells 103, 104, respectively. At this time, since a width and a length of the gate electrodes 106 of the transfer transistor 20 are equal to those of the actuating transistor 10, the channel width and length of the transfer transistor are equal to those of the actuating transistor 10. That is, in order to increase the cell ratio of the SRAM cell, the cell ratio can be increased by increasing a surface resistance of the gate electrodes and the source/drain of the transfer transistor 20 until it is larger than that of the actuating transistor 10 of the SRAM without the size of the transistors.

Also, spacers 107 are formed on the side walls of the gate electrodes 106 and n+ source/drain 108 of the transfer transistor 20 is formed on the n-well 103 and n+ source/drain 109 of the actuating transistor 20 is formed on the n-well 104. Here, each of the source/drains 108, 109 may employ a lightly doped drain (LLD) structure.

Figure 3B:
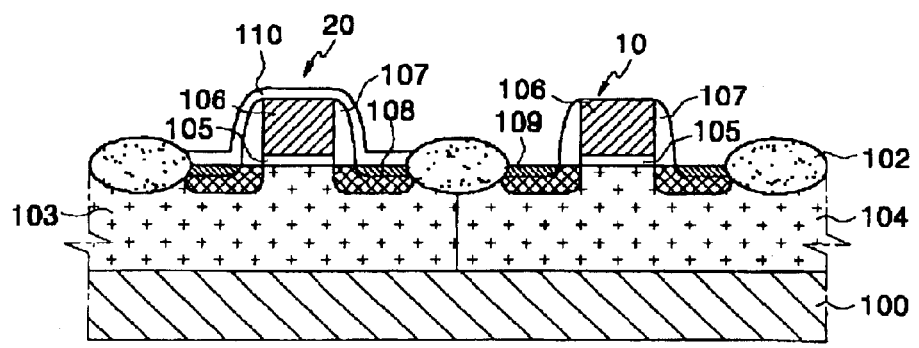

Subsequently, as shown in FIG. 3b, a silicon oxide layer is formed on a top portion of the transfer transistor 20 formed on the resultant structure.

Figure 3C:
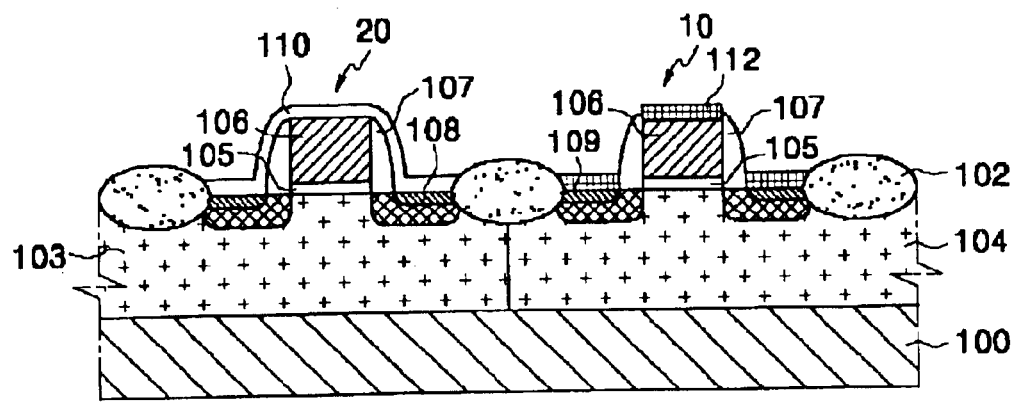

In the next step, as shown in FIG. 3c, a silicide layer 112 is formed on top of the gate electrode 106 of the actuating transistor 10 and top surfaces of the source/drain 109 by performing a salicide process. At this time, since the silicide blocking layer 110 is formed on a region of the transfer transistor 20, the silicide layer is not formed on top of the gate electrode 106 of the transfer transistor 20 and on the top surface of the source/drain 108. Resultantly, since the silicide layer 112 is formed on the gate electrode 106 of the actuating transistor 10 and the source/drain 109, a surface resistance decreases, whereas surface resistance of the gate electrode 106 of the transfer transistor 20 and the source/drain 109 increases.

Figure 3D:
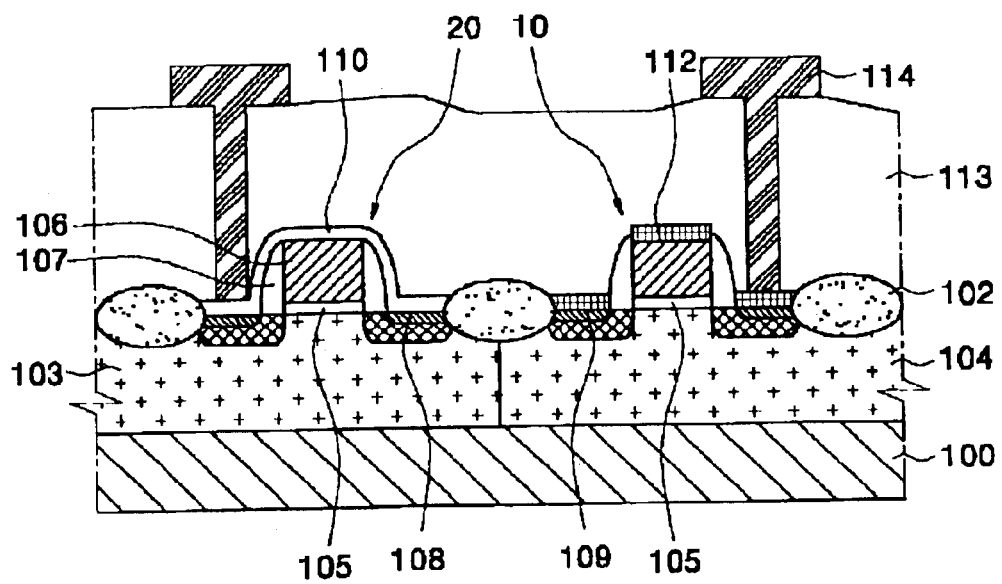

Then, as shown in FIG. 3d, an interlayer insulating layer 113 is formed along the entire of the resultant structure, contact holes are formed in the interlayer insulating layer 113 and contact electrodes 114 are formed in the contact holes with a conductive material to connect the source/drains 108, 109 of the actuating transistor 10 and the transfer transistor 20 to each other.

Therefore, after the silicide blocking layer 110 is formed on top of the gate electrode 106 and the source/drain 108 of the transfer transistor 20 is formed, the present invention selectively forms the silicide layer 112 only on the actuating transistor 10, thereby reducing the surface resistance of the gate electrode 106 and the source/drain 109 of the actuating transistor 10 in comparison with those of the transfer transistor 20. Accordingly, a current driving ability of the present invention is reduced by increasing the resistance of the source/drain 108 of the transfer transistor 20 to larger than that of the actuating transistor 10.

Thus, if the transfer transistor 20 and the actuating transistor 10 are manufactured with the same minimum size, in accordance with the preferred embodiment of the present invention, since the silicide layer 112 is formed on the source/drain 109 of the actuating transistor 10 and the silicide layer 112 is not formed on the source/drain 108 of the transfer transistor 20, the current driving force of the actuating transistor 10 becomes larger than that of the transfer transistor 20 to thereby increase the cell ratio of the SRAM.

As described above, since the present invention does not form a silicide on the transfer transistor without increasing the size of the SRAM cell, it is capable of increasing the surface resistance of the source/drain, whereby the actuating transistor is capable of increasing the cell ratio of the SRAM cell by increasing the current driving force of the transfer transistor by reducing the surface resistance of the source/drain by forming the silicide on the actuating transistor.

Therefore, the present invention has an advantage in that the reliability and yield of products are improved by increasing the cell ratio of the SRAM cell, although the size of the SRAM cell is scaled down in response to the high integration of a semiconductor device.

While the present invention has been described with respect to the preferred embodiments, other modifications and variations may be made without departing from the spirit and scope of the present invention as set forth in the following claims.

What is claimed is:

1. A structure of a static random access memory (SRAM) having an asymmetric silicide layer, wherein the SRAM is provided with transfer transistors and actuating transistors, the structure comprising:

a semiconductor substrate provided with a lower structure with a predetermined configuration;

a gate insulating layer and gate electrodes of the transfer transistors and the actuating transistors formed on the semiconductor substrate spaced at a predetermined distance;

a spacer formed on side walls of the gate electrodes of the transfer transistors and the actuating transistors, respectively;

source/drain electrodes of the transfer transistors and the actuating transistors implanted into a portion of the semiconductor substrate placed between the gate electrodes;

a silicide blocking layer formed on a top of a region of the transfer transistors and a silicide layer formed on a top of the gate electrodes of the actuating transistors and surface of the source/drain electrodes.

2. The structure of claim 1, wherein the silicide blocking layer is made of an oxide material.

3. The structure of claim 1, wherein the gate electrodes of the transfer transistors have a width equal to those of the gate electrodes of the actuating transistors.

* * * * *

UNITED STATES PATENT AND TRADEMARK OFFICE
CERTIFICATE OF CORRECTION

PATENT NO. : 6,777,734 B2
DATED : August 17, 2004
INVENTOR(S) : Byung-ho Min et al.

It is certified that error appears in the above-identified patent and that said Letters Patent is hereby corrected as shown below:

Column 6,
Line 22, please delete "transistors" and insert -- transistor; -- in its place.

Signed and Sealed this

Fifth Day of April, 2005

JON W. DUDAS
*Director of the United States Patent and Trademark Office*